United States Patent [19]
Wang et al.

[11] Patent Number: 4,689,771
[45] Date of Patent: Aug. 25, 1987

[54] MEMORY WITH IMPROVED WRITE MODE TO READ MODE TRANSITION

[75] Inventors: Karl L. Wang; Mark D. Bader, both of Austin, Tex.

[73] Assignee: Motorola, Inc., Schaumburg, Ill.

[21] Appl. No.: 835,679

[22] Filed: Mar. 3, 1986

[51] Int. Cl.$^4$ .............................................. G11C 11/40
[52] U.S. Cl. .................................... 365/189; 365/230
[58] Field of Search ............... 365/182, 189, 195, 230, 365/206

[56] References Cited

U.S. PATENT DOCUMENTS 4,644,500  2/1987  Yonezu et al. ....................... 365/189
4,651,308  3/1987  Sato ..................................... 365/230

Primary Examiner—Terrell W. Fears
Attorney, Agent, or Firm—John A. Fisher; Jeffrey Van Myers; James L. Clingan, Jr.

[57] ABSTRACT

A memory has a read mode in which data is read from a bit line pair selected by a column address and a write mode in which data is written onto a selected bit line pair. The selected bit line pair is coupled to a data line pair via a column decoder in response to a column address. Upon a transition from the write mode to the read mode the column decoder is disabled from coupling the selected data line to the data line pair for the duration of a column disable pulse. The column disable pulse is generated in response to a write transition pulse or a column transition pulse or both. The column transition pulse is generated in response to a change in the column address. The write transition pulse is generated in response to a write to read transition.

8 Claims, 4 Drawing Figures

MEMORY WITH IMPROVED WRITE MODE TO READ MODE TRANSITION

CROSS-REFERENCE TO RELATED APPLICATIONS

Related subject matter is disclosed in U.S. application Ser. No. SC-00129A, entitled "Bit Line Equalization In A Memory," filed simultaneously herewith and assigned to the assignee hereof.

FIELD OF THE INVENTION

The present invention relates to memories which have a read mode and a write mode, and more particularly to memories which must terminate the write mode before the read mode can commence.

BACKGROUND OF THE INVENTION

In static random access memories (SRAMs), there is a specification known as "write high to data don't care" (TWHDX) which must be zero. The "write high" refers to a write enable signal (*WE) switching from a logic low to a logic high. The asterisk (*) is used to indicate that the signal is active at a logic low. When the write enable signal *WE is a logic low, the SRAM is in a write mode. When signal *WE is a logic high, the SRAM is in a read mode. Consequently, the TWHDX specification relates to the time that the data must be valid with respect to the SRAM changing from the write mode to the read mode. In particular, the requirement is that the data on the input can change simultaneously with a change from the write mode to the read mode without the new data, which is considered invalid, being written into the SRAM. This is a reasonable expectation of a user of the SRAM that data on the input will not be written if write enable signal *WE is switched to a logic high. In practice this specification is more difficult to achieve than would be immediately apparent.

The problem is that the invalid data may reach the memory cell before the write enable signal can turn off the write circuitry. There are data lines which are written onto in the write mode and which are sensed in the read mode. Memory cells are arrayed at intersections of word lines and bit line pairs. The word lines are selectively enabled by a row decoder. The bit line pairs are selectively coupled to the data lines via a column decoder. A memory cell is selected when its word line is enabled and its bit line pair is coupled to the data lines. In switching from the write mode to the read mode, the write circuitry is decoupled from the data lines in response to the write enable signal switching from a logic low to a logic high. There is a write enable buffer which causes a delay in the write enable signal being able to effectively decouple the write circuitry from the data lines. If the invalid data reaches the data lines then there is a risk that the selected memory cell will be written into with the invalid data. There is then a race condition between the write enable buffer and the write circuitry. The solution has been to add delay in the write circuitry to ensure that the buffered write enable signal reaches the write circuitry before the write circuitry outputs the invalid data onto the data lines. Adding delay in order to meet the requirement that TWHDX be zero adds to the time required to perform a write. Consequently, the TWHDX requirement adversely affects other write specifications.

Not only must the TWHDX specification be met but it is desirable that it be exceeded for guard banding purposes. Although guard banding is generally considered most desirable from a manufacturing standpoint for reasons such as testing, in this case guard banding is also desirable for the user. It is desirable that the SRAM actually ignore data changes that occur a few nanoseconds before the write to read switch because the user may have difficulty ensuring that the data doesn't change before signal *WE changes. These difficulties may arise from his own timing circuitry as well as printed circuit board layout problems. Consequently, it is desirable that the actual TWHDX of the SRAM be negative by a small amount, such as two nanoseconds (ns) using current MOS technology. Ensuring that the TWHDX specification is met has resulted in a speed penalty in writing.

SUMMARY OF THE INVENTION

An object of the present invention is to provide an improved write termination technique in a memory.

Another object of the invention is to reduce the delay requirement in write circuitry of a memory.

Yet another object of the invention is to provide an improved circuit for using write to read transition information in a memory.

These and other objects are achieved in a memory having a plurality of memory cells, a column decoder, a column address transition circuit, a write enable transition circuit, and a data line equalization circuit. The memory has a write mode in which data is written into a selected memory cell via a selected bit line pair and a read mode in which data is read from a selected bit line pair. The plurality of memory cells are coupled to word lines and bit line pairs at intersections thereof. Each memory cell receives data from or provides data to the bit line pair to which it is coupled when the word line to which it is coupled is enabled. The column decoder couples a selected bit line pair to a data line pair as determined by a column address and is disabled in response to a column decoder disable pulse. The column address transition detection circuit provides a column transition pulse in response to a column address transition. The write enable transition circuit provides the column decoder disable pulse in response to a transition from the write mode to the read mode. The data line equalization circuit equalizes the data line pair in response to the column transition pulse.

DESCRIPTION OF THE INVENTION

Figure 1:
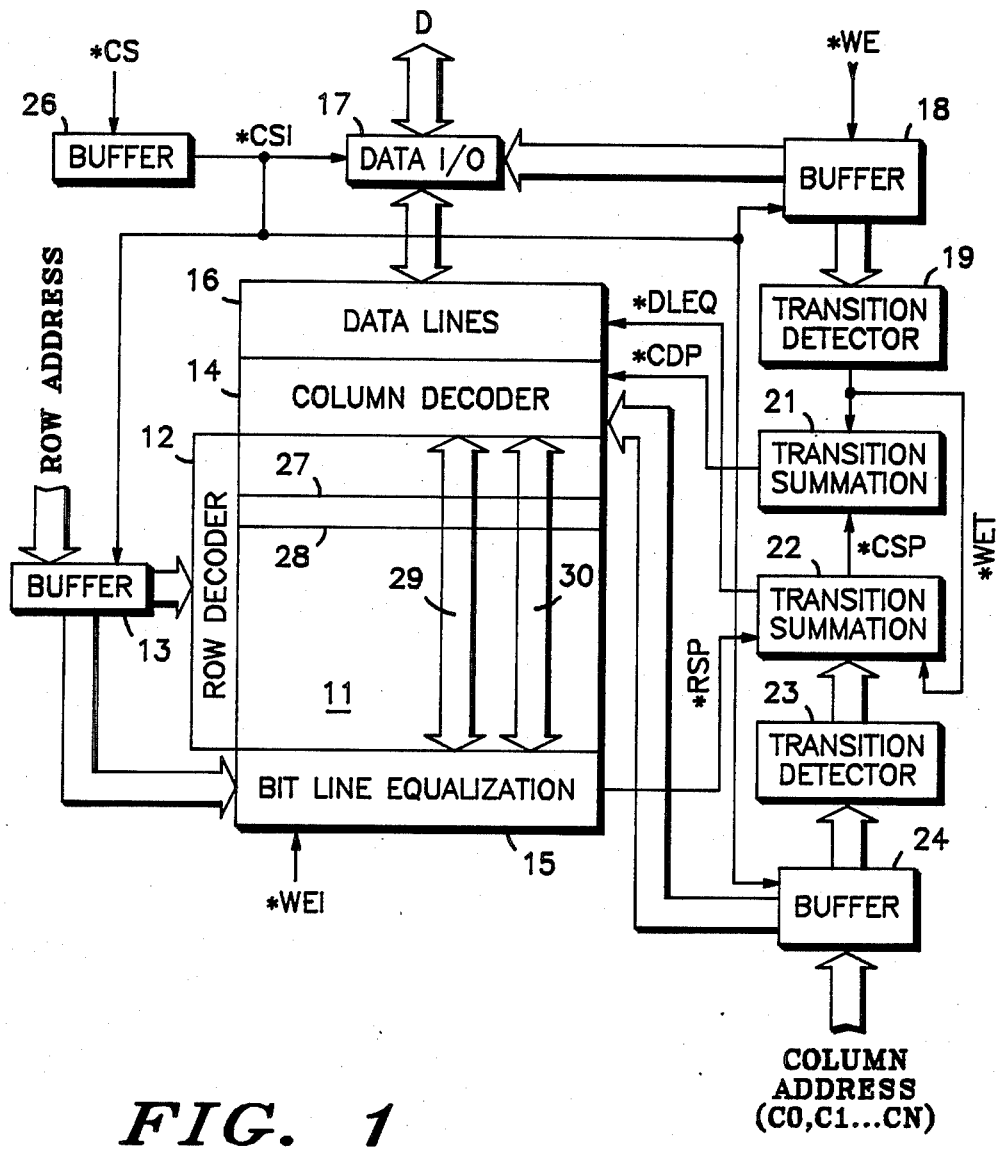
FIG. 1 is a block diagram of the invention according to a preferred embodiment of the invention.

Shown in FIG. 1 is a static random access memory (SRAM) 10 comprised generally of an array 11, a row decoder 12, a row address buffer 13, a column decoder 14, a bit line equalization circuit 15, data lines 16, a data I/O circuit 17, a write enable buffer 18, a write enable transition detector 19, a transition summation circuit 21, a transition summation circuit 22, a column address transition detector 23, a column address buffer 24, and a chip select buffer 26. Array 11 is comprised of SRAM cells located at intersections of word lines and bit line pairs. Word lines 27 and 28 and bit line pairs 29 and 30 are shown in FIG. 1. Buffer 26 receives a chip select signal *CS and provides an internal chip select signal *CSI in response thereto. The asterisk (*) before a signal indicates that the signal is active at a logic low. In the case of signal *CS, memory 10 is selected when signal *CS is a logic low and deselected when signal *CS is a logic high. Data I/O circuit 17 either receives or provides a data signal D. Signal D, in a ×1 memory, is a single signal. Signal D, in a by ×4 or ×8, memory can be more. For example, 4 or 8 bit line pairs can be selected for a single column address so that data signal D could be 4 or 8 signals respectively. Buffer 18 receives a write enable signal *WE and provides an internal write enable signal *WEI to bit line equalization circuit 15 and several other write enable derived signals to data I/O 17 in response to write enable signal *WE. When signal *WE is a logic high, memory 10 is in a read mode. When signal *WE is a logic low, memory 10 is in a write mode. Data I/O circuit provides data signal D as an output when memory 10 is in the read mode and receives signal D as an input when memory 10 is in the write mode. Column decoder 14 is connected to the bit line pairs of array 11. Data lines 16 are comprised of 4 data line pairs and circuitry for equalizing the data line pairs. The data line pairs of data lines 16 are connected to column decoder 14. Row decoder 12 is connected to the word lines of array 11.

Transition detector 19 is connected to buffer 18 and provides a signal *WET as a logic low pulse in response to a logic low to logic high transition of write enable signal *WE. Transition detector 23 is connected to buffer 24 and detects a transition of the column address. The column address is comprised of a plurality of column address signals. Column address signals C0, C1, and CN are shown in FIG. 1. Transition detector 23 provides a corresponding output to transition detector 23 provides a corresponding output to transition summation circuit 22 for each of the column address signals which comprise the column address. A column address signal pulse is provided on the output of transition detector 23 which corresponds to the column address signal which changed logic states. Consequently, transition summation circuit 22 receives a pulse for each column address signal which changes logic states. Transition summation circuit 22 also receives pulse *WET. Transition summation circuit 22 provides a column summation signal *CSP as a logic low pulse and a data line equalization signal *DLEQ as a logic high pulse in response to receiving any column address signal pulse or pulse *WET and a data line equalization signal DLEQ as a logic high pulse in response to receiving any column address signal pulse, a row address transition summation signal *RSP at a logic low, or pulse *WET. Signal *RSP is provided as a logic low pulse by bit line equalization circuit 15 in response to a row address transition. Transition summation circuit 21 functions as an AND gate having inputs for receiving pulses *CSP and *WET and an output for providing a column disable signal *CDP as a logic low pulse in response to an occurrence of either pulse *CSP or *WET or both.

A memory cell located in array 11 is enabled when the word line to which it is connected is enabled. Row decoder 12 is connected to the word lines of array 11 such as word lines 27 and 28. The word line which is selected to be enabled is selected by a row address. Row address buffer 13 receives the row address and couples it in buffered form to row decoder 12. Row decoder 12 decodes the received row address and enables the word line selected thereby. Similarly, column decoder 14 couples selected bit line pairs to data lines 16. In the present embodiment, column decoder 14 couples 4 bit line pairs to corresponding data line pairs of data lines 16 for a particular column address. Each memory cell, as is characteristic of SRAM cells, can either have data written into or read from it. This is achieved via the bit line pair to which the memory cell is coupled. When the word line to which the memory cell is coupled is enabled the contents of the memory are made available to the bit line pair for reading or writing. In the read mode, the enabled memory cell causes the two bit lines of the bit line pair to which it is coupled to separate in voltage. If the bit line pair is selected, this voltage separation is coupled to a data line pair of data lines 16 via column decoder 14, is sensed by a sense amplifier present in data I/O 17, and is subsequently output as part of data signal D. In the write mode, an enabled memory cell may be written into if the bit line pair to which it is coupled is selected. If selected, the bit line pair is polarized in voltage so as to write data into the enabled memory cell. In the write mode, the four data line pairs of data lines 16 are polarized in voltage by data I/O 17 which writes onto these four data line pairs according to received data signal D. A selected bit line pair is written onto by being coupled to one of the polarized data line pairs via column decoder 14. Bit line equalization circuit 15 is responsive to a row address change and in response to the internal write enable signal *WEI and provides for equalization of the bit lines.

Column decoder 14 is disabled in response to pulse *CDP switching to a logic low. Pulse *CDP will typically stay at a logic low for about 10 ns in response to pulse *WET or pulse *CSP. Pulse *CSP will pulse to a logic low in response to any column address change or a change from the write mode to the read mode. In the case of a write to read transition, data I/O must switch from being a data in buffer and a write driver to being a sense amplifier and a data out buffer. This conversion is done in response to the signals provided by buffer 18. Upon a change in signal *WE switching from a logic low to a logic high, a standard specification in the industry, known as write high to data don't care (TWHDX), requires that signal D also be allowed to change without any adverse effect such writing invalid data into a cell. Before invalid data could be written into a memory cell, the invalid data must first propagate through the write circuitry. The last stage of the write circuitry is typically called a write driver. One of the signals generated by buffer 18 in response to signal *WE is a write driver enable signal WDE. Signal WDE is generated at a logic high when memory 10 is in the write mode and at logic low when memory 10 is in the read mode. Signal WDE enables the write driver at logic high and disables the write driver at a logic low. Consequently, if write driver enable signal WDE received by data I/O is switched to a logic low before the invalid data reaches the write driver, the invalid data is prevented from reaching a memory cell. In order to ensure this, however, the propagation delay through the write circuitry must be ensured of being at least long enough for signal WDE to reach the write driver of data I/O 17.

A better technique, shown in FIG. 1, uses a pulse, pulse *CDP, to disable column decoder 14 in response to a write mode to read mode transition. Of course the write driver must still be disabled so that sensing can occur. Disabling the column decoder takes advantage of the propagation delay through the write circuitry of data I/O 17 to the column decoder being longer than the propagation delay to the write driver. Pulse *CDP is generated very quickly with a minimum of delay. Transition summation circuit 21 combines only two signals so has very little propagation delay. The important transition is the logic low to logic high transition of signal *WE. Transition detection circuitry can generally be optimized for either a rising edge or a falling edge. Transition detector 19 can easily be made for rapid detection of the logic low to logic high transition of signal *WE. Accordingly, pulse *CDP can be generated at least as quickly as signal WDE can be switched from a logic high to a logic low. Signal *CDP disconnects the write path at a point in the write path which has a greater propagation delay than the point at which signal WDE disconnects the write path. This provides an opportunity to remove some of the delay from the write circuitry which has been required in the past to ensure meeting the write high to data don't care specification. Consequently, data I/O 17 can write faster because the required delay in the write circuitry is reduced.

Another advantageous aspect of the quick disabling of the column decoder is that the bit line pairs are isolated from data lines 16 before the bit line pairs begin being equalized after a write. This prevents data lines 16 from loading bit line equalization circuit 15.

Figure 2:
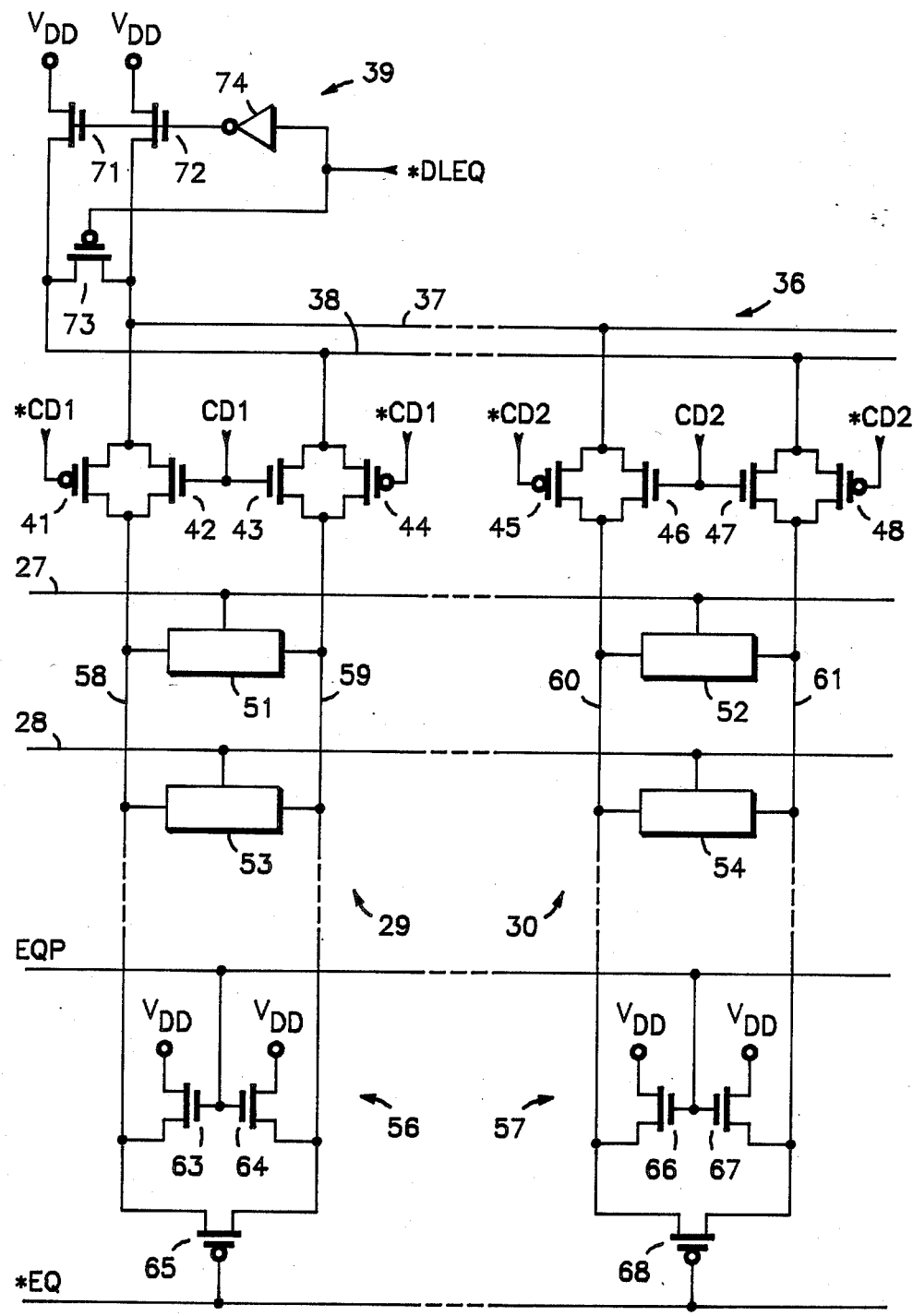
FIG. 2 is a circuit diagram of a portion of the memory of FIG. 1 according to a preferred embodiment of the invention.

Shown in FIG. 2 is a portion of array 11, a portion of column decoder 14, a portion of data lines 16, and a portion of bit line equalization circuit 15. The portion of data lines 16 shown in FIG. 2 is a data line pair 36 comprised of a data line 37, a data line 38, and an equalization circuit 39. Equalization circuit 39 is comprised of N channel transistors 71 and 72, a P channel transistor 73, and a CMOS inverter 74. The portion of column decoder 14 shown in FIG. 2 is comprised of coupling transistors 41, 42, 43, 44, 45, 46, 47, and 48. The portion of array 11 shown in FIG. 2 is comprised of word lines 27 and 28, bit line pairs 29 and 30, a memory cell 51 coupled to word line 27 and bit line pair 29, a memory cell 52 coupled to word line 27 and bit line pair 30, a memory cell 53 coupled to word line 28 and bit line pair 29, a memory cell 54 coupled to word line 28 and bit line pair 30, an equalization circuit 56 coupled to bit line pair 29, and an equalization circuit 57 coupled to bit line pair 30. Bit line pair 29 is comprised of bit lines 58 and 59. Bit line pair 30 is comprised of bit lines 60 and 61. Equalization circuit 56 is comprised of N channel transistors 63 and 64 and a P channel transistor 65. Equalization circuit 57 is comprised of N channel transistors 66 and 67 and P channel transistor 68. The N channel transistors are N channel, enhancement mode, insulated gate field effect transistors. The P channel transistors are P channel, enhancement mode, field effect transistors. The threshold voltage is about 0.6 volt for the N channel transistors and about −0.6 volt for the P channel transistors. In the case of the N channel transistors, the threshold voltage increases to about 1.0 volt when the source reaches 3-4 volts due to the well known body effect. Equalization circuit 39 is comprised of N channel transistors 71 and 72, P channel transistor 73, and inverter 74.

Transistor 42 is an N channel transistor having a first current electrode connected to data line 37, a second current electrode coupled to bit line 58, and a control electrode for receiving a column decoder output signal CD1. Transistor 43 is an N channel transistor having a first current electrode connected to data line 38, a second current electrode coupled to bit line 59, and a control electrode for receiving column decoder output signal CD1. Transistor 46 is an N channel transistor having a first current electrode connected to data line 37, a second current electrode coupled to bit line 60, and a control electrode for receiving a column decoder output signal CD2. Transistor 47 is an N channel transistor having a first current electrode connected to data line 38, a second current electrode coupled to bit line 61, and a control electrode for receiving column decoder output signal CD2. Transistor 41 is a P channel transistor having a first current electrode connected to data line 37, a second current electrode coupled to bit line 58, and a control electrode for receiving a column decoder output signal *CD1 which is complementary to signal CD1. Transistor 44 is a P channel transistor having a first current electrode connected to data line 38, a second current electrode coupled to bit line 59, and a control electrode for receiving column decoder output signal *CD1. Transistor 45 is a P channel transistor having a first current electrode connected to data line 37, a second current electrode coupled to bit line 60, and a control electrode for receiving a column decoder output signal *CD2 which is complementary to signal CD2. Transistor 48 is a P channel transistor having a first current electrode connected to data line 38, a second current electrode coupled to bit line 61, and a control electrode for receiving column decoder output signal *CD2.

Transistor 63 has a first current electrode coupled to a positive power supply terminal VDD for receiving, for example, 5 volts, a second current electrode coupled to bit line 58, and a control electrode for receiving an equalization precharge signal EQP. Transistor 64 has a first current electrode coupled to VDD, a second current electrode coupled to bit line 59, and a control electrode for receiving signal EQP. Transistor 65 has a first current electrode coupled to bit line 58, a second current electrode coupled to bit line 59, and a control electrode for receiving a bit line equalization signal *EQ. Transistor 66 has a first current electrode coupled to a positive power supply terminal VDD, a second current electrode coupled to bit line 60, and a control electrode for receiving an equalization precharge signal EQP. Transistor 67 has a first current electrode coupled to VDD, a second current electrode coupled to bit line 61, and a control electrode for receiving signal EQP. Transistor 68 has a first current electrode coupled to bit line 60, a second current electrode coupled to bit line 60, and a control electrode for receiving a bit line equalization signal *EQ. Inverter 74 has an input for receiving signal *DLEQ, and an output. Transistor 71 has a first current electrode coupled to VDD, a second current electrode coupled to data line 38, and a control electrode coupled to the output of inverter 74. Transistor 72 has a first current electrode coupled to VDD, a second current electrode coupled to data line 37, and a control electrode coupled to the output of inverter 74. Transistor 73 has a first current electrode coupled to data line 37, a second current electrode coupled to data line 38, and a control electrode for receiving signal *DLEQ.

In a write mode data line pair 36 is polarized and is coupled to one of the bit line pairs in array 11. Assuming that memory cell 51 is selected, signal CD1 is a logic high so that transistors 41–44 are conducting and data line pair 36 is coupled to bit line pair 29. With bit line pair 29 coupled to data line pair 36, the logic states of bit lines 58 and 59 are driven to the same logic states as that present on data lines 37 and 38, respectively. Word line 27 is enabled so that memory cell 51 can receive the logic states present on bit lines 58 and 59. There is a minimum amount of time that the bit lines must be polarized to opposite logic states while word line 27 is enabled to ensure that memory cell 51 is effectively written into. In the read mode, word line 27 is enabled which causes the contents of memory cell 51 to be output onto bit lines 58 and 59. Memory cell 51 causes a voltage differential between bit lines 58 and 59 which is coupled to data lines 37 and 38 via transistors 41–44. The voltage differential is then sensed and interpreted as either a logic high or a logic low and output as such.

During the read mode, signal EQP is held at voltage which is one N Channel threshold voltage below VDD. If VDD is 5.0 volts, signal EQP is at about 4.0 volts. This ensures that neither bit line 29 nor bit line 59 will drop below two N channel threshold voltages below VDD. Two threshold voltages below VDD would then be about 3.0 volts including body effect. When there is a row address transition during the read mode, signal EQP pulses to VDD for the duration of the logic low pulse width of signal *EQ to bring both bit lines of a bit line pair to one N channel threshold voltage below VDD. Signal *EQ pulses to logic low in response to any row address transition but is otherwise a logic high during a read or write. Circuit 39 equalizes data lines 37 and 38 in response to signal *DLEQ pulsing to a logic low in response to a column address change, a row address change, or a change from the write to the read mode. When signal *DLEQ is a logic low, transistor 73 is conducting and inverter 74 provides a logic high output at VDD which causes data lines 37 and 38 to be equalized at one N channel threshold voltage below VDD, the same as the bit lines.

Figure 3:
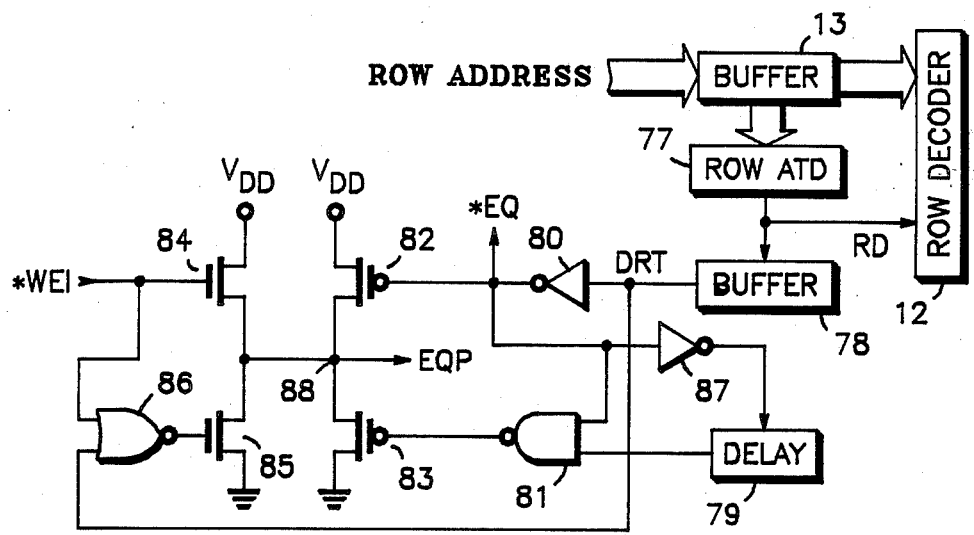
FIG. 3 is combination block, logic, and circuit diagram according to a preferred embodiment of the invention.

Shown in FIG. 3 is row address buffer 13, row decoder 12, and a portion of bit line equalization circuit 15 which generates signals *EQ and EQP which is a control pulse circuit 76. Control pulse circuit 76 is comprised of a row address transition detection and summation circuit 77, a buffer circuit 78, a delay circuit 79, an inverter 80, a NAND gate 81, a P channel transistor 82, a P channel transistor 83, an N channel transistor 84, an N channel transistor 85, and a NOR gate 86, and an inverter 87. Circuit 77 is coupled to row address buffer 13 and provides a row decoder disable signal RD as a logic high pulse in response to any change in the row address. Row decoder 12 receives signal RD and is disabled for the duration of the logic high pulse width of signal RD. Buffer circuit 78 has an input for receiving signal RD, and an output for providing a delayed row address transition signal DRT. Signal DRT is the same as signal RD except that it is delayed about 2 ns due to buffer 78. Inverter 80 has an input for receiving signal DRT, and an output for providing signal *EQ. Inverter 87 has an input connected to the output of inverter 80, and an output. Delay circuit 79 has an input connected to the output of inverter 87, and an output. NAND gate 81 has a first input connected to the output of inverter 80, a second input connected to the output of delay circuit 79. Transistor 82 has a control electrode connected to the output of inverter 80, a first current electrode connected to VDD, and a second current electrode connected to a node 88. Signal EQP is generated at node 88. Transistor 83 has a control electrode connected to the output of NAND gate 81, a first current electrode connected to ground, and a second current electrode connected to node 88. Transistor 84 has control electrode for receiving signal *WEI, a first current electrode coupled to VDD, and a second current electrode connected to node 88. NOR gate 86 has a first input for receiving signal *WEI, a second input connected to the output of delay buffer 78, and an output. Transistor 85 has a control electrode connected to the output of NOR gate 86, a first current electrode connected to ground, and a second current electrode connected to node 88.

When signal *WEI is a logic high, indicative of the read mode, transistor 84 is conducting. The logic high of signal *WEI also forces NOR gate 86 to output a logic low which causes transistor 85 to be non-conductive. Signal *WEI at a logic high is provided in a conventional CMOS manner so that it is at VDD. Node 88 will tend to be driven to VDD minus the threshold voltage of transistor 84. Transistor 84 will thus tend to drive node 88, and thus signal EQP, to about 4.0 volts for the case in which VDD is at about 5.0 volts. Signal DRT is normally a logic low and only pulses to a logic high in response to a row address transition. When signal DRT is a logic low, inverter 80 provides signal *EQ at a logic high so that transistor 82 is not conducting. Inverter 87 provides a logic low output to delay circuit 79 which in turn provides a logic low output to NAND gate 81. NAND 81 gate thus provides a logic high output which causes transistor 83 to be non-conductive. With transistor 83 non-conductive, there is no current drain from node 88 so that signal EQP is provided at one N channel threshold voltage below VDD.

In response to a row address transition in the read mode, signal RD switches to a logic high for about 10 ns. The delay of buffer circuit 78 is about 2 ns so that signal DRT switches to a logic high about 2 ns after signal RD switches to a logic high and switches to a logic low about 2 ns after signal RD switches to a logic low. Upon signal DRT switching to a logic high, inverter 80 responds by switching its output to a logic low which causes transistor 82 to be conductive. The logic low provided by inverter 80 to NAND gate 81 holds the output of NAND gate 81 at logic high so that transistor 83 remains non-conductive. Signal EQP is then provided at VDD. After the delay time of delay circuit 79, the output of delay 79 becomes a logic high. After signal DRT switches back to a logic low, inverter 80 outputs a logic high which causes transistor 82 to be non-conductive and NAND gate 81 to provide a logic low output for the duration of the delay of delay circuit 79. Transistor 83 responds by becoming conductive which pulls signal EQP down to a little below one threshold voltage below VDD. After the time delay of delay circuit 79, the output of delay circuit 79 switches to a logic low which causes NAND gate 81 to provide a logic high output, causing transistor 83 to become non-conductive. After signal DRT switches to a logic low, it is desirable to release the bit lines to be separated by the enabled memory cell. This is achieved by having transistor 83 reduce the voltage of signal EQP. Transistor 83 is conductive for about the duration of the delay of delay circuit 79 which is sufficient to bring signal EQP to at least one N channel threshold voltage below VDD.

In the write mode, signal *WEI is a logic low which causes transistor 84 to be non-conductive and NOR gate 86 to be responsive to signal DRT. In in the absence of a row address transition, signal DRT is a logic low so that NOR gate outputs a logic high to transistor 85, causing transistor 85 to be conductive. Signal *EQ is a logic high and transistors 82 and 83 are non-conductive when signal DRT is a logic low. Consequently, in the absence of a row address transition, signal EQP is held to a logic low by transistor 85 during the write mode. In response to a row address transition, signal DRT pulses to a logic high which causes signal *EQ to switch to a logic low, transistor 82 to become conductive, and NOR gate 86 to output a logic low pulse of the same duration as the logic high pulse of signal DRT. Transistor 85 responds by becoming non-conductive for this same duration. Signal EQP is thus pulsed to a logic high for the duration of the logic high of signal DRT. The output of NAND gate 81 is held to a logic high for the pulse duration by signal *EQ being a logic low. When signal DRT switches back to a logic low, signal *EQ switches back to a logic high, transistor 82 becomes non-conductive, NOR gate 86 outputs a logic high, transistor 85 becomes conductive, and signal EQP switches to a logic low. The output of NAND gate 81 pulses to a logic low so that transistor 83 is conductive for the duration of the delay of delay 79. The time that transistor 83 is conductive is concurrent with the time that transistor 85 is conductive. A row address transition during a write thus causes signal EQP to switch from a logic low at ground to a logic high of VDD for the duration of the logic high pulse of signal DRT.

When signal *WEI switches to a logic high, indicative of switching to the read mode, transistor 84 becomes conductive and transistor 85 becomes non-conductive. This causes signal EQP to rise to one N channel threshold voltage below VDD. Signal EQP then causes half of the bit lines which have enabled memory cells to begin charging toward two N channel threshold voltages below VDD. In the write mode, at least the selected bit line pairs which have been written to a logic low are essentially at ground potential. Also in the write mode, signal EQP is a logic low so that the selected memory cells of the unselected bit lines may bring one of the pair of bit lines lower than is possible during the read mode. Consequently, half of the bit lines which have enabled memory cells will be charged in response to signal EQP reaching one N channel threshold voltage below VDD in response to a write to read mode transition. A row address transition which follows will then cause signal EQP to rise to VDD. The two step rise to VDD reduces the peak current which is drawn from the VDD power supply in order to charge the bit lines to the desired level. Peak current is important because that has a significant effect on power supply and ground noise that is generated by virtue of the particular event which is drawing the current. The amount of charge which is required to obtain the desired voltage on the bit lines is a function of capacitance of the bit lines. For a given amount of time for charging the bit lines to the desired level, the optimum charge rate should be constant. The current is desirably the same throughout the particular charging duration for the lowest peak current. The current is related to the gate to the source voltage of the charging transistor such as transistor 63 of FIG. 2. The two step rise of signal EQP approximates the desired constant current. The first step is for signal EQP to reach one N channel threshold voltage below VDD which causes the bit lines to become partially charged so that when signal EQP reaches VDD in the second step, the gate to source voltage is not as great as it would be if signal EQP switched quickly to its peak voltage as was done in the prior art. Consequently, the peak current is reduced by the two step rise of signal EQP.

Figure 4:
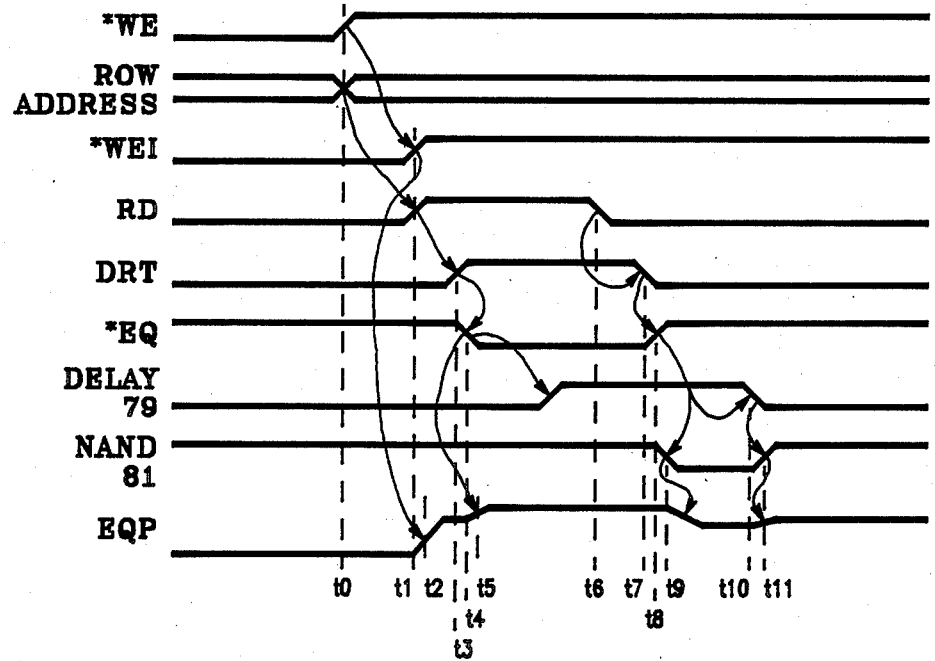
FIG. 4 is a timing diagram useful in understanding the operation of the portion of the memory shown in FIG. 3.

Signal DRT is inherently delayed with respect signal *WEI which ensures that there is a two step rise even if the row address changes at the same time that signal *WE switches from a logic low to a logic high. Signal EQP which actually brings the bit lines to the final precharge voltage is driven by signal *EQ which is inherently slower than the speed at which signal *WEI can be switched. There is thus essentially no speed penalty in charging the bit lines to the final precharge voltage while reaping the benefits of reduced peak current. Shown in FIG. 4 is a timing diagram for the case in which a row address transition and a write to read transition occur simultaneously.

Signal *WE switches from a logic low to a logic high and the row address changes state at a time t0. Signal *WEI and signal RD respond in about the same amount of time so that both switch to a logic high at a time t1. Signal EQP responds to signal *WEI by rising, at a time t2, to one N channel threshold voltage below VDD. Signal DRT responds to signal RD at a time t3 by rising to a logic high. The time between time t1 and t3 is the time delay of buffer circuit 78. Signal *EQ responds to signal DRT switching to a logic high by switching to a logic low at a time t4. Signal EQP responds to a signal *EQ switching to a logic low by switching to VDD at a time t5.

The pulse width of signal DRT is the same as that of signal RD which is at least a predetermined time duration of, for example, 9 ns but can be longer depending on the severity of address skew, if any. Address skew occurs when more than one address signal changes state in which there is some separation in time between the changes. Address skew is well known in the art. After the predetermined time duration signal RD switches back to a logic low at a time t6. Signal DRT is switched back to a logic low by signal RD at a time t7 which causes signal *EQ to switch back to a logic high at a time t8. When signal *EQ switches to a logic high, both inputs to NAND gate 81 are a logic high which causes NAND gate 81 to provide a logic low output at a time t9. The logic low output of NAND gate 81 causes transistor 83 to be conductive so that signal EQP begins dropping toward about 3 volts. After the delay of delay circuit 79, the output of delay circuit 79 becomes a logic high at a time t10 which causes the output of NAND gate 81 to provide a logic high output at a time t11 which causes signal EQP to rise to one threshold voltage below VDD. This is the level of EQP at which sensing occurs.

The bit line voltages are equalized at one threshold voltage below VDD prior to sensing by signal EQP being at VDD. During sensing, EQP is held at one threshold voltage below VDD so that the bit line which is pulled to the lower voltage will tend to be held at about two N channel threshold voltages below VDD. This reduces the amount of precharging which must be achieved to prepare for the next read.

We claim:

1. A memory having a write mode, indicated by a write enable signal being in a first logic state, for writing data into a selected memory cell via a selected bit line pair, and a read mode, indicated by the write enable signal being in a second logic state, for reading data provided onto a selected bit line pair, comprising:
- a plurality of memory cells located at intersections of word lines and bit line pairs, each memory cell receiving data from or providing data to the bit line pair to which it is coupled when the word line to which it is coupled is enabled;
- a row decoder, coupled to the word lines, for enabling a selected word line as determined by a row address;
- a column decoder for coupling a selected bit line pair to a data line pair as determined by a column address;
- bit line equalization means, coupled to the bit line pairs, for equalizing the voltages on the bit line pairs in response to a row address transition;
- column address transition detection means for providing a column transition pulse in response to a column address transition;
- write enable transition detection means for providing a write transition pulse in response to the write enable signal switching from the second logic state to the first logic state;
- column decoder disable means for disabling the column decoder in response to the write transition pulse; and
- data line equalization means for equalizing the data line pair in response to the column transition pulse.

2. A memory having a write mode in which data is written into a selected memory cell via a selected bit line pair, and a read mode in which data is read from a selected bit line pair, comprising:
- a plurality of memory cells coupled to word lines and bit line pairs at intersections thereof, each memory cell receiving data from or providing data to the bit line pair to which it is coupled when the word line to which it is coupled is enabled;
- a column decoder for coupling a selected bit line pair to a data line pair as determined by a column address and for being disabled in response to a column decoder disable pulse;
- column address transition detection means for providing a column transition pulse in response to a column address transition;
- write enable transition detection means for providing the column decoder disable pulse in response to a transition from the write mode to the read mode; and
- data line equalization means for equalizing the data line pair in response to the column transition pulse.

3. The memory of claim 2 wherein the write enable detection means is further characterized as providing the column decoder disable pulse in response to a transition of the column address.

4. The memory of claim 3 wherein the write enable transition detection means comprises:
- a write enable transition pulse generator for generating a write enable transition pulse in response to a transition from the write mode to the read mode; and
- summation means for providing the column decoder disable pulse in response to either the column transition pulse or the write enable transition pulse, or both.

5. The memory of claim 2 wherein the column address transition means is further characterized as providing the column address transition pulse in response to a transition from the write mode to the read mode.

6. The memory of claim 4 wherein the column address transition means is further characterized as providing the column address transition pulse in response to a transition from the write mode to the read mode.

7. In a memory having a write mode for writing data into a selected memory cell via a selected bit line pair, a read mode for reading data provided onto a selected bit line pair, and a plurality of memory cells located at intersections of word lines and bit line pairs, wherein a memory cell receives data from or provides data to the bit line pair to which it is coupled when the word line to which it is coupled is enabled, and wherein bit line pairs are selectively coupled to a data line pair via a column decoder which receives a column address; a method comprising the steps of:
- generating a write transition pulse in response to a transition from the write mode to the read mode;
- generating a column transition pulse in response to a column address transition;
- generating a column decoder disable pulse in response to either the write transition pluse or the column transition pluse or both; and
- disabling the column decoder from coupling a selected bit line to the data line in response to the generation of the column decoder disable pulse.

8. In a memory having a write mode for writing data into a selected memory cell via a selected bit line pair, a read mode for reading data provided onto a selected bit line pair, and a plurality of memory cells located at intersections of word lines and bit line pairs, wherein a memory cell receives data from or provides data to the bit line pair to which it is coupled when the word line to which it is coupled is enabled, and wherein bit line pairs are selectively coupled to a data line pair via a column decoder which receives a column address comprised of a plurality of column address signals; a method comprising the steps of:
- generating a write transition pulse in response to a transition from the write mode to the read mode;
- generating a column transition pulse in response to a transition of one or more of the column address signals;
- generating a column decoder disable pulse in response to either the write transition pluse or the column transition pluse or both; and
- disabling the column decoder from coupling a selected bit line to the data line in response to the generation of the column decoder disable pulse.

* * * * *